US010115588B2

(12) United States Patent
Hashimoto et al.

(10) Patent No.: US 10,115,588 B2
(45) Date of Patent: Oct. 30, 2018

(54) SUBSTRATE TREATING APPARATUS AND SUBSTRATE TREATING METHOD

(71) Applicant: SCREEN Holdings Co., Ltd., Kyoto (JP)

(72) Inventors: Koji Hashimoto, Kyoto (JP); Akito Hatano, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 26 days.

(21) Appl. No.: 15/515,768

(22) PCT Filed: Jul. 6, 2015

(86) PCT No.: PCT/JP2015/069463
§ 371 (c)(1),
(2) Date: Mar. 30, 2017

(87) PCT Pub. No.: WO2016/051899
PCT Pub. Date: Apr. 7, 2016

(65) Prior Publication Data
US 2017/0301540 A1    Oct. 19, 2017

(30) Foreign Application Priority Data
Sep. 30, 2014    (JP) .................................. 2014-201024

(51) Int. Cl.
*H01L 21/677*    (2006.01)
*H01L 21/02*    (2006.01)
(Continued)

(52) U.S. Cl.
CPC ........ *H01L 21/02422* (2013.01); *B65G 49/06* (2013.01); *C03C 15/00* (2013.01);
(Continued)

(58) Field of Classification Search
CPC ......... H01L 21/67763; H01L 21/67772; H01L 21/67778; H01L 21/6779; H01L 21/681
See application file for complete search history.

(56) References Cited

U.S. PATENT DOCUMENTS

| 5,906,469 A | 5/1999 | Oka et al. ..................... 414/416 |
| 6,267,245 B1 | 7/2001 | Bores et al. .................. 206/711 |

(Continued)

FOREIGN PATENT DOCUMENTS

| JP | 9-148404 A | 6/1997 |
| JP | 2005-116807 A | 4/2005 |

(Continued)

OTHER PUBLICATIONS

International Search Report dated Sep. 29, 2015 in corresponding PCT International Application No. PCT/JP2015/069463.
(Continued)

*Primary Examiner* — Phat X Cao
(74) *Attorney, Agent, or Firm* — Ostrolenk Faber LLP

(57) ABSTRACT

A substrate treating apparatus including an unloading order changing unit. The unloading order changing unit reverses an order, in regard to unloading of substrates in a carrier from the top, between a poor inclined substrate and a substrate at least immediately above the poor inclined substrate when the poor inclined substrate is present whose inclination is determined larger than a pre-set threshold by a poor inclination determining unit. That is, the order is reversed such that the poor inclined substrate whose surface may be possibly be scratched with a hand is unloaded prior to the substrate immediately above the poor inclined substrate. Accordingly, this inhibits damages on the substrate caused by scratching a substrate surface with the hand of a substrate transport mechanism.

7 Claims, 11 Drawing Sheets

(51) Int. Cl.
  *C03C 15/00* (2006.01)
  *C23C 16/458* (2006.01)
  *H01L 21/67* (2006.01)
  *H01L 27/12* (2006.01)
  *H01L 29/66* (2006.01)
  *B65G 49/06* (2006.01)

(52) U.S. Cl.
  CPC .......... *C23C 16/4581* (2013.01); *H01L 21/02* (2013.01); *H01L 21/677* (2013.01); *H01L 21/6779* (2013.01); *H01L 21/67276* (2013.01); *H01L 21/67763* (2013.01); *H01L 21/67772* (2013.01); *H01L 21/67778* (2013.01); *H01L 27/1262* (2013.01); *H01L 29/66757* (2013.01)

(56) References Cited

U.S. PATENT DOCUMENTS

| | | | | |
|---|---|---|---|---|
| 7,260,448 | B2* | 8/2007 | Goto | H01L 21/67259 414/937 |
| 9,627,238 | B2* | 4/2017 | Morikawa | H01L 21/67265 |
| 2005/0123383 | A1 | 6/2005 | Goto et al. | 414/416.08 |
| 2011/0000817 | A1 | 1/2011 | Hosoi et al. | 206/710 |
| 2012/0290124 | A1 | 11/2012 | Kimura | 700/218 |
| 2014/0178162 | A1 | 6/2014 | Morikawa et al. | 414/416.08 |
| 2014/0305540 | A1* | 10/2014 | Oyama | H01L 21/67389 141/4 |

FOREIGN PATENT DOCUMENTS

| | | |
|---|---|---|
| JP | 2012-235058 A | 11/2012 |
| JP | 5185417 B2 | 4/2013 |
| JP | 2014-143388 A | 8/2014 |
| TW | 201007874 A1 | 2/2010 |

OTHER PUBLICATIONS

Written Opinion dated Sep. 29, 2015 in corresponding PCT International Application No. PCT/JP2015/069463.

Office Action dated Jun. 8, 2016 in corresponding Taiwanese Patent Application No. 104125108.

* cited by examiner (a)

(b)

(c)

SUBSTRATE TREATING APPARATUS AND SUBSTRATE TREATING METHOD

CROSS-REFERENCE TO RELATED APPLICATIONS

The present application is a 35 U.S.C. §§ 371 national phase conversion of PCT/JP2015/069463, filed Jul. 6, 2015, which claims priority to Japanese Patent Application No. 2014-201024, filed Sep. 30, 2014, the contents of both of which are incorporated herein by reference. The PCT International Application was published in the Japanese language.

TECHNICAL FIELD

The present invention relates to a substrate treating apparatus and a substrate treating method for treating substrates such as semiconductor substrates, glass substrates for a liquid crystal display, glass substrates for a photomask, and optical disk substrates.

BACKGROUND ART

A substrate treating apparatus includes a mount table on which a carrier (container) is placed, the carrier (container) accommodating substrates such that the substrates are laminated vertically by given gaps, a treating section that performs given treatment to the substrates, and a substrate transport mechanism (transporting robot) provided between the mount table and the treating section. The substrate transport mechanism includes a hand that holds the substrates. The substrate transport mechanism transports the substrates from the carrier placed on the mount table, and accommodates the substrates from the treating section into the carrier.

The substrate treating apparatus also includes a pair of transmission type sensors each with a light emitter and a light detector. The light emitter and the light detector face to each other so as to sandwich a part of a circle periphery of the substrate from a front side of the substrate along a substrate surface. The transmission type sensors each with the light emitter and the light detector move within the carrier in a substrate laminated direction. At this time, the transmission type sensors and a level sensor detect a number of pieces and positions of substrates within the carrier, and also detect whether or not the substrates are arranged on top of one another.

Patent Literature 1 discloses a carrier for precluding a problem about vibration or bouncing of substrates upon transportation. Such a carrier C includes a container main body 101, and a removable lid (door) 102 as illustrated in FIG. 13(a). When the lid 102 is detached from the container main body 101, side holders (wafer supports) 103 on interior side faces S1 and S2 of the container main body 101 (see FIG. 13(b)) support substrates W. In contrast to this, when the lid 102 is attached to the container main body 101 as illustrated in FIG. 13(c), V-shaped grooves 107a of a front holder (first cushion) 107 and V-shaped grooves 105a of a rear holder (second cushion) 105 hold while lifting up the substrates W from the side holders 103. The front holder (first cushion) 107 is disposed on a face F directed to the interior container main body 101 of the lid 102, and the rear holder (second cushion) 105 is disposed on a rear face R of the interior container main body 101. Examples of the carrier C with the above configuration include a MAC (Multi Application Carrier).

Moreover, Patent Literature 2 discloses the following. That is, a vertical "clearance" between adjacent substrates within a cassette is detected, and operation of a substrate transporting arm is varied depending on the clearance, whereby collision is avoidable between the substrate transporting arm and the substrate. Moreover, Patent Literature 3 discloses the following. That is, a "clearance" is calculated between adjacent substrates stored within a cassette in multiple stages in a vertical direction, and permission or prohibition of entry of a robot hand is determined on the basis of the clearance, whereby the substrates within the cassette are able to be unloaded safely.

Patent Literature 1: Japanese Patent No. 5185417
Patent Literature 2: Japanese Unexamined Patent Publication No. H9-148404A
Patent Literature 3: Japanese Unexamined Patent Publication No. 2012-235058A

SUMMARY OF INVENTION

Technical Problem

However, the currently-used apparatus may fail to hold the substrates within the carrier in correct positions. When the hand of the substrate transport mechanism enters into the carrier under such a condition for loading the substrates, the hand may interfere with the substrates to contact and scratch surfaces of the substrates or damage the substrates.

The present invention has been made regarding the state of the art noted above, and its one object is to provide a substrate treating apparatus and a substrate treating method that allow no damage on substrates.

Solution to Problem

The present invention is constituted as stated below to achieve the above object. One aspect of the present invention provides a substrate treating apparatus. The substrate treating apparatus includes a mount unit on which a carrier for accommodating a plurality of substrates is placed, a substrate level detecting mechanism that detects presence/absence of a substrate and a level of the substrate, a substrate condition acquiring unit that acquires an inclination of the substrate in a forward/backward direction relative to a horizontal direction in accordance with the detected presence/absence of the substrate and the detected level of the substrate, a poor inclination determining unit that determines whether or not the inclination of the substrate is larger than a pre-set threshold, and an unloading order changing unit that reverses an order, in regard to unloading of the plurality of substrates in the carrier from the top, between the poor inclined substrate and a substrate at least immediately above the poor inclined substrate when the poor inclination determining unit determines presence of the poor inclined substrate.

With the substrate treating apparatus according to the aspect of the present invention, when the poor inclined substrate is present whose inclination is determined larger than the pre-set threshold by the poor inclination determining unit, the unloading order changing unit reverses the order, in regard to unloading of the substrates in the carrier from the top, between the poor inclined substrate and the substrate at least immediately the poor inclined substrate. That is, the order is reversed such that the poor inclined substrate whose surface may be possibly be scratched with the hand is unloaded prior to the substrate immediately above the poor inclined substrate. Accordingly, this inhibits damages on the substrate caused by scratching the substrate surface with the hand of the substrate transport mechanism.

Moreover, it is preferred that, when successive poor inclined substrates are present, the unloading order changing unit of the substrate treating apparatus reverses the order between a poor inclined substrate of the successive poor inclined substrates on the lowermost stage and a substrate at least immediately above the poor inclined substrate of the successive poor inclined substrates on the uppermost stage. Accordingly, the order is changeable such that the poor inclined substrate that may be scratched with the hand is unloaded from the bottom even when the successive poor inclined substrates are present. This inhibits damages on the substrates.

Moreover, it is preferred that the unloading order changing unit of the substrate treating apparatus reverses the order between a substrate at least immediately below the poor inclined substrate and a substrate at least immediately above the poor inclined substrate. If the poor inclined substrate is inclined forward, a clearance between the poor inclined substrate and the substrate immediately below the poor inclined substrate may be smaller than usual, leading to possibility of contacting the hand to the substrate. Consequently, the order is reversed such that the substrate immediately below the poor inclined substrate is unloaded prior to the poor inclined substrate. Accordingly, the above possibility of contact is avoidable.

Moreover, it is preferred that the carrier of the substrate treating apparatus further includes a container main body, a lid that closes an opening of the container main body and is attachable/detachable to/from the container main body, a side holder provided on both side faces of the interior container main body and places the substrates thereon, a rear holder provided on a rear face of the interior the container main body and having grooves formed thereon, and a front holder provided on a face of the lid directed to the interior container main body and having grooves formed thereon. It is also preferred that the rear holder and the front holder nip the substrates while separating the substrates from the side holder when the lid is attached to the opening of the container main body.

When the lid that closes the opening of the container main body is detached, the substrates may not slide down properly from the grooves of the rear holder to remain at a forward-inclined condition. Even under such a condition, the order is reversed such that the poor inclined substrate whose surface may be scratched with the hand is unloaded prior to the substrate immediately above the poor inclined substrate. This inhibits damages on the substrates.

Moreover, one embodiment of the substrate level detecting mechanism in the substrate treating apparatus includes a presence/absence sensor that is directed horizontally orthogonal to the forward/backward direction where the substrates are loaded/unloaded into/from the carrier and detects presence/absence of the substrate, a level sensor that detects a level of the presence/absence sensor, a vertical moving mechanism that moves the presence/absence sensor vertically, an entering/exiting mechanism that moves the presence/absence sensor into the carrier through the opening of the carrier, and a controller that detects substrate levels at two or more different positions in the forward/backward direction by moving the presence/absence sensor vertically with the vertical moving mechanism and detecting the presence/absence of the substrates with the presence/absence sensor and detecting a level of the presence/absence sensor with the level sensor while the presence/absence sensor enters into the carrier with the entering/exiting mechanism.

The controller causes the vertical moving mechanism to move the presence/absence sensor vertically, and causes the presence/absence sensor to detect the presence/absence of the substrates and causes the level sensor to detect the level of the presence/absence sensor under the condition where the presence/absence sensor enters into the carrier with the entering/exiting mechanism. This allows detection of the substrate levels at two or more different positions in the forward/backward direction. Accordingly, the substrate condition acquiring unit allows acquirement of the substrate inclination in the forward/backward direction relative to the horizontal direction in accordance with the substrate levels at the detected two or more different positions in the forward/backward direction, whereby the poor inclination determining unit allows determination of whether or not the substrate inclination is larger than the pre-set threshold.

Moreover, another aspect of the present invention provides a substrate treating method. The substrate treating method includes a detecting step of detecting presence/absence and levels of a plurality of substrates in a carrier placed on a mount unit with a substrate level detecting mechanism, an acquiring step of acquiring an inclination of a substrate in a forward/backward direction relative to a horizontal direction in accordance with the detected presence/absence and the detected levels of the substrates with a substrate condition acquiring unit, a determining step of determining whether or not the inclination of the substrate is larger than a pre-set threshold with a poor inclination determining unit, a changing step of reversing an order, in regard to unloading of the plurality of substrates in the carrier from the top, between the poor inclined substrate and a substrate at least immediately above the poor inclined substrate with an unloading order changing unit when the poor inclination determining unit determines presence of the poor inclined substrate.

With the substrate treating method according to the other aspect of the present invention, the unloading order changing unit reverses the order, in regard to unloading of the substrates in the carrier from the top, between the poor inclined substrate and the substrate at least immediately above the poor inclined substrate when the poor inclined substrate is present whose inclination is determined larger than the pre-set threshold by the poor inclination determining unit. That is, the order is reversed such that the poor inclined substrate whose surface may be possibly be scratched with the hand is unloaded prior to the substrate immediately above the poor inclined substrate. Accordingly, this inhibits damages on the substrate caused by scratching the substrate surface with the hand of the substrate transport mechanism.

Another aspect of the present invention provides a substrate treating apparatus. The substrate treating apparatus includes a mount unit on which a carrier for accommodating a plurality of substrates is placed, a substrate level detecting mechanism that detects presence/absence of the substrates and levels of the substrates, a substrate condition acquiring unit that acquires an inclination of a substrate in a forward/backward direction relative to a horizontal direction in accordance with the detected presence/absence of the substrates and the detected levels of the substrates, a poor inclination determining unit that determines whether or not the inclination of the substrate is larger than a pre-set threshold, and an unloading order changing unit that sets an unloading order between a poor inclined substrate and a substrate immediately above the poor inclined substrate so as to unload the poor inclined substrate prior to the substrate immediately above the poor inclined substrate when the poor inclination determining unit determines presence of the poor inclined substrate, and sets an order of unloading substrates other than the poor inclined substrate and the substrate immediately above the poor inclined substrate.

With the substrate treating apparatus according to the other aspect of the present invention, when the poor inclined substrate is present whose inclination is determined larger than the threshold by the poor inclination determining unit, the unloading order changing unit sets the unloading order, in regard to unloading of the plurality of substrates in the carrier, so as to unload the poor inclined substrate from the carrier prior to the substrate immediately above the poor inclined substrate, and sets an unloading order of substrates other than the poor inclined substrate and the substrate immediately above the poor inclined substrate. That is, the order is set such that the poor inclined substrate whose surface may be possibly be scratched with the hand is unloaded prior to the substrate immediately above the poor inclined substrate. Accordingly, this inhibits damages on the substrate caused by scratching the substrate surface with the hand of the substrate transport mechanism.

Advantageous Effects of Invention

With the substrate treating apparatus and the substrate treating method according to the aspects of the present invention, the unloading order changing unit sets the order, in regard to unloading of the plurality of substrates in the carrier, so as to unload the poor inclined substrate prior to the substrate at least immediately above the poor inclined substrate when the poor inclined substrate is present, the poor inclined substrate being determined by the poor inclination determining unit that the substrate inclination is larger than the pre-set threshold. That is, the order is set such that the poor inclined substrate whose surface may be possibly be scratched with the hand is unloaded prior to the substrate immediately above the poor inclined substrate. Accordingly, this inhibits damages on the substrate caused by scratching the substrate surface with the hand of the substrate transport mechanism.

EMBODIMENT

Figure 1:
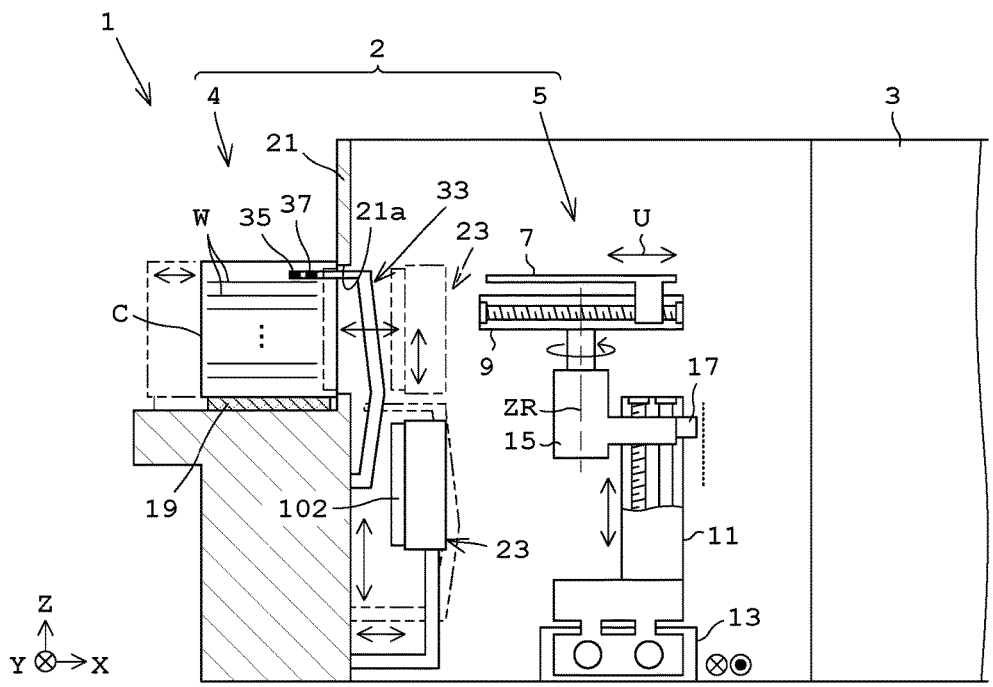
FIG. 1(a) is a side view schematically illustrating a substrate treating apparatus according to Embodiment 1.
FIG. 1(b) is a side view of a lid attaching/detaching part.
FIG. 1(c) is a side view of a mapping part.
Figure 1:
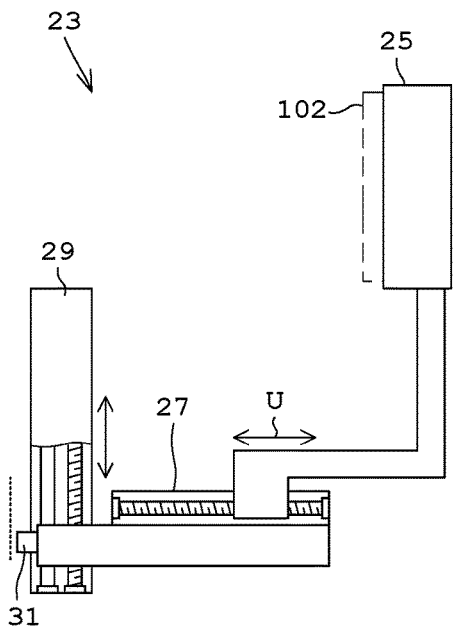
Figure 1:
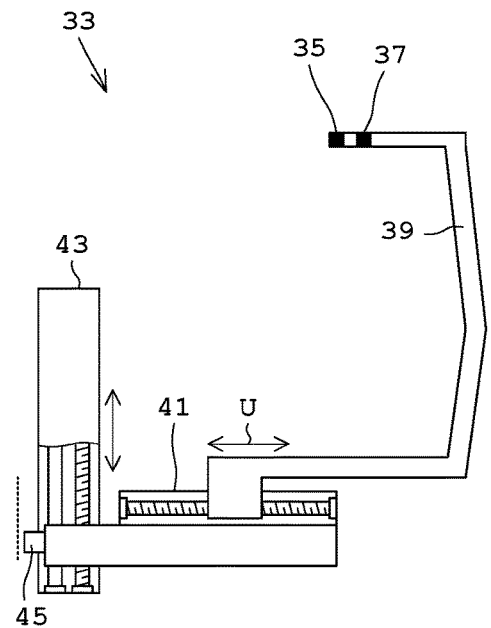
Figure 2:
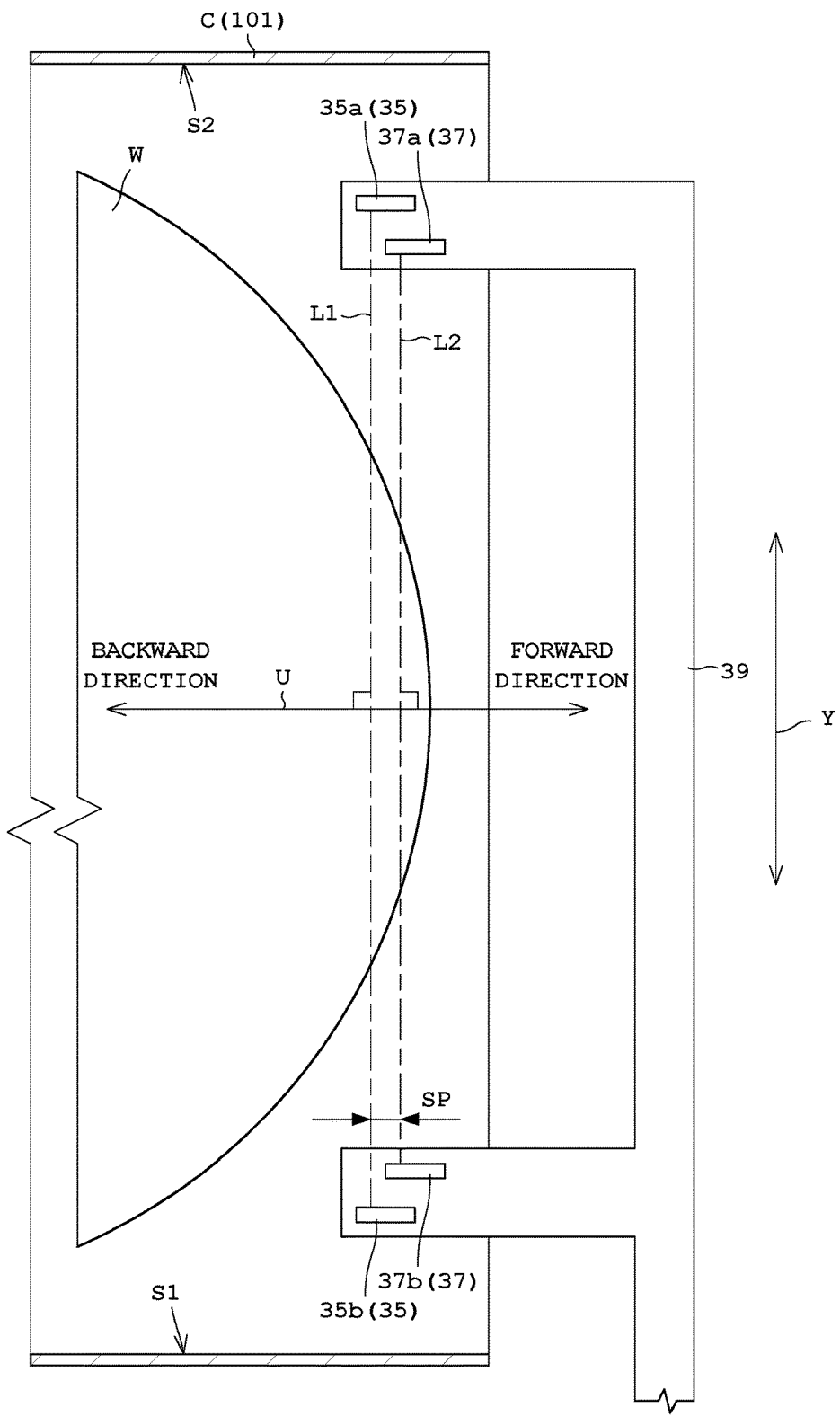
FIG. 2 is a plan view illustrating two pairs of mapping sensors.

The following describes Embodiment 1 of the present invention with reference to drawings. FIG. 1(a) is a side view schematically illustrating a substrate treating apparatus according to Embodiment 1. FIG. 1(b) is a side view of a lid attaching/detaching part. FIG. 1(c) is a side view of a mapping part. FIG. 2 is a plan view illustrating two pairs of mapping sensors.

Reference is made to FIG. 1(a). A substrate treating apparatus 1 includes an indexer 2, and a treating section 3 that performs given treatment to substrates W. The treating section 3 allows various types of substrate treatment, and includes one or more treating units for performing treatment such as a resist coating, a developing process, and a heat treatment.

The indexer 2 includes a mount table 4 on which a carrier C for accommodating a plurality of substrates W in multiple stages is placed, and a substrate transport mechanism 5 disposed between the mount table 4 and the treating section 3. The substrate transport mechanism 5 unloads a substrate W from the carrier C to the treating section 3, and accommodates the substrate W unloaded from the treating section 3 into the carrier C.

The substrate transport mechanism 5 includes a hand 7 that holds the substrates W, a hand entering/exiting unit 9 that moves the hand 7 in a forward/backward direction U in the carrier C, a hand lifting unit 11 that moves the hand 7 in an upward/downward direction (i.e., a Z-direction for a vertical direction). The substrate transport mechanism 5 further includes a transverse moving unit 13 that moves the hand 7 transversely (in a Y-direction) along a plurality of (e.g., four) mount tables 4, a vertical rotator 15 that is provided between the hand entering/exiting unit 9 and the hand lifting unit 11 and rotates the hand 7 around a vertical axis ZR, and a level sensor 17 that detects a level of the hand 7 and the like. Here in FIG. 1(a) and the like, the forward/backward direction U conforms to the X-direction.

The substrate transport mechanism 5 may include two hands 7. In this case, the entering/exiting unit 9 moves the two hands 7 so as not to interfere with each other. In addition, the hand entering/exiting unit 9, the transverse moving unit 13, and the vertical rotator 15 may be formed with an articulated arm mechanism. FIG. 1(a) illustrates the hand 7 not reaching the carrier C for convenience. In actual, the hand 7 reaches the carrier C to achieve unloading and accommodation of the substrates W. The hand entering/exiting unit 9, the hand lifting unit 11, the transverse moving unit 13, and the vertical rotator 15 are each driven with a motor and a speed reducer. Moreover, the level sensor 17 is composed of a linear encoder or a rotary encoder.

Configuration of Carrier

Figure 13:
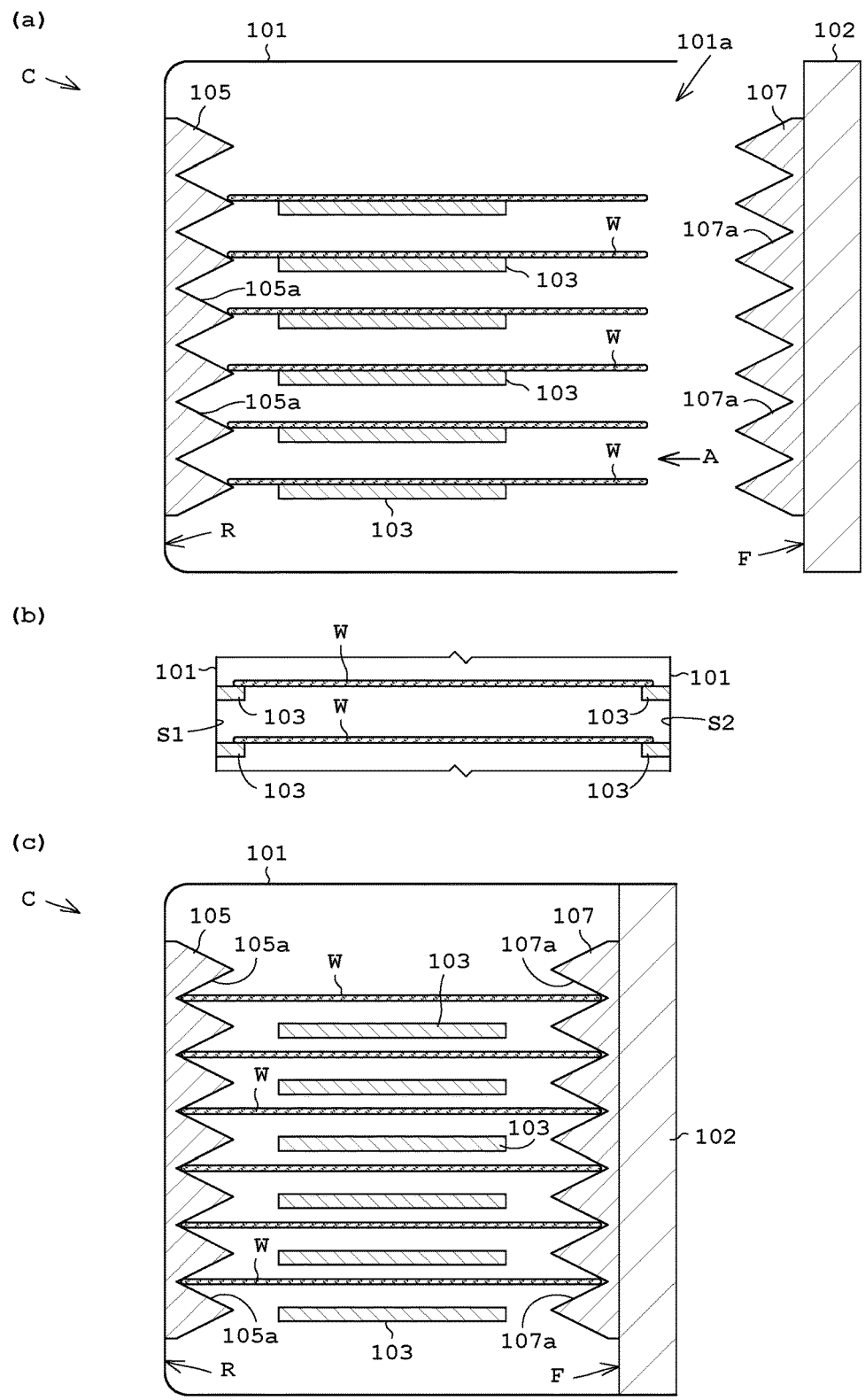
FIGS. 13(a) to (c) each illustrate one example of a carrier, FIG. 13(b) a partial front view of the carrier seen from a numeral A in FIG. 13(a).

The following describes the carrier C in the present embodiment. The above so-called MAC is used for the carrier C. Reference is made to FIG. 13. FIGS. 13(a) and 13(c) are each a side view of the carrier C. FIG. 13(b) is a partial front view of the carrier C seen from a numeral A in FIG. 13(a).

The carrier C includes a container main body 101, and a lid 102 that closes an opening 101a of the container main body 101 and is attachable/detachable to/from the container main body 101. The carrier C also includes side holders 103 provided on both side faces S1 and S2 (see FIG. 13(b)) of the interior container main body 101 for placing the substrates W thereon, and a rear holder 105 provided on a rear face R of the interior container main body 101 having V-shaped grooves 105a formed thereon, and a front holder 107 provided on a face of the lid 102 directed to the interior container main body 101 and having V-shaped grooves 107a formed thereon.

Here, the grooves 105a and 107a are not limited to V-shaped ones, but may have another shape, such as a U-shape, in which grooves are narrower toward depth.

Such a carrier C causes variation in holding condition of the substrates W depending on whether or not the lid 102 is attached to the container main body 101. When the lid 102 that closes the opening 101a of the container main body 101 is detached as illustrated in FIG. 13(a), the rear holder 105 and the front holder 107 release their nipping of the substrates W. At this time, if the substrates W appropriately slide downward from the V-shaped grooves 105a of the rear holder 105, the substrates W are placed on the side holders 103 in a horizontal attitude. In contrast to this, when the lid 102 is attached to the opening 101a of the container main body 101 as illustrated in FIG. 13(c), the rear holder 105 and the front holder 107 nip the substrates W while separating the substrates W from the side holders 103.

Configuration of Mount Table

The following describes the mount table 4. Reference now returns to FIG. 1(a). A plurality of (e.g., four) mount tables 4 are provided. The mount tables 4 include a stage 19. A division wall 21 is disposed between the mount tables 4 and the substrate transport mechanism 5. The stage 19 causes the carrier C to move close to/away from the division wall 21 with a carrier moving mechanism not shown. Here, the mount tables 4 or the stage 19 corresponds to the mount unit in the present invention.

The division wall 21 includes a pass port 21a facing to the carrier C whose size is substantially same as the carrier C. The substrate transport mechanism 5 selectively performs unloading and accommodation of the substrates W from and into the carrier C through the pass port 21a. When the carrier C is placed on the stage 19 and the carrier C contacts the division wall 21, the pass port 21a is released by a lid attaching/detaching part 23. Otherwise, the pass port 21a is closed with the lid attaching/detaching part 23 for shielding an atmosphere of the treating section 3 from that of the mount tables 4.

As illustrated in FIG. 1(b), the lid attaching/detaching part 23 includes a shutter 25 that performs attachment/detachment of the lid 102 to/from the container main body 101 of the carrier C and holds the detached lid 102, and a lid entering/exiting unit 27 that causes the shutter 25 to move in the forward/backward direction U. The lid attaching/detaching part 23 further includes a lid lifting unit 29 that moves the shutter 25 upward/downward, and a level sensor 31 that detects a level of the shutter 25 and the like. The lid entering/exiting unit 27 and the lid lifting unit 29 are each driven with a motor, a speed reducer, and the like. The level sensor 31 is composed of a linear encoder or a rotary encoder, for example.

The lid attaching/detaching part 23 opens the pass port 21a, and detaches the lid 102 from the container main body 101 of the carrier C to hold the lid 102. Besides, the lid attaching/detaching part 23 closes the pass port 21a, and attaches the held lid 102 to the opening 101a of the container main body 101 to seal the carrier C. Moreover, the substrate treating apparatus 1 further includes a mapping part 33 on one side of the pass port 21a adjacent to the treating section 3. The mapping part 33 operates independently of the lid attaching/detaching part 23.

The following describes a summary of the present invention. The mapping part 33 of the substrate treating apparatus 1 of the present invention includes two pairs of mapping sensors 35 and 37 in FIGS. 1(c) and 2. This detects substrate levels of the substrates W within the carrier C at two different positions in the forward/backward direction U, and acquires inclinations of the substrates W in the forward/backward direction relative to the horizontal direction in accordance with the detected substrate levels. Then, it is determined whether or not each of the inclinations of the substrates W is larger than a pre-set threshold. If a poor inclined substrate Wf whose inclination is determined larger is present, an order regarding to unloading of the substrates W within the carrier C from the top is reversed between the poor inclined substrate Wf and a substrate W immediately above the poor inclined substrate Wf, i.e., a substrate W upwardly away from the poor inclined substrate Wf by one stage. Accordingly, the poor inclined substrate Wf that may be scratched with the hand 7 of the substrate transport mechanism 5 is unloaded prior to the substrate W immediately above (one stage above) the poor inclined substrate Wf, leading to prevention of damages on the substrate W. The following specifically describes the mapping part 33 and the like.

Reference is made to FIG. 1(c). The mapping part 33 includes two pairs of mapping sensors 35 and 37, a sensor holder 39 that holds the two pairs of mapping sensors 35 and 37, and a sensor entering/exiting unit 41 that causes the mapping sensors 35 and 37 to either enter into or exit from the carrier C through the opening 101a of the carrier C. The mapping part 33 further includes a sensor lifting unit 43 that moves the two pairs of mapping sensors 35 and 37 vertically, and a level sensor 45 that detects levels of the two pairs of sensor mapping sensors 35 and 37.

The sensor entering/exiting unit 41 causes the mapping sensors 35 and 37 to enter/exit. Alternatively, the sensor entering/exiting unit 41 may cause the two pairs of mapping sensors 35 and 37 to translate in parallel in the forward/backward direction U as in FIG. 1(c). Moreover, the sensor entering/exiting unit 41 may cause the two pairs of mapping sensors 35 and 37 to rotate around a pre-set position as the rotation center. The sensor entering/exiting unit 41 may perform combination of translation and rotation. In such a case, the sensor entering/exiting unit 41 causes the mapping sensors 35 and 37 to either enter into or exit from the carrier C through the opening 101a of the carrier C and to move in the forward/backward direction U.

The sensor entering/exiting unit 41 and the sensor lifting unit 43 are each driven a motor, a speed reducer, and the like. The level sensor 45 is composed of a linear encoder or a rotary encoder, for example. The sensor entering/exiting unit 41 corresponds to the entering/exiting mechanism in the present invention, and the sensor lifting unit 43 corresponds to the vertical moving mechanism in the present invention.

FIG. 2 is a plan view of the two pairs of mapping sensors 35 and 37 disposed adjacent to tip ends of the sensor holder 39. FIG. 2 also illustrates a condition in which the sensor entering/exiting unit 41 causes the two pairs of mapping sensors 35 and 37 to enter into the carrier C, i.e., illustrates a detection position in a horizontal direction (XY-direction) with the mapping sensors 35 and 37.

The mapping sensors 35 and 37 of the mapping part 33 are directed horizontally orthogonal to the forward/backward direction U, and detect presence/absence of the substrate W. The mapping sensors 35 and 37 are two-paired for detecting presence/absence of the substrate W at different positions in the forward/backward direction U. Here, the mapping sensors 35 and 37 correspond to the presence/absence sensor in the present invention.

The mapping sensors 35 and 37 are each composed of a transmission type sensor, and include light emitters 35a and 37a and light detectors 35b and 37b, respectively. The light emitters 35a and 37a face to the light detectors 35b and 37b, respectively. The light detectors 35b and 37b of the mapping sensors 35 and 37 receive light emitted from the light emitters 35a and 37a. This achieves detection of whether or not light is shielded by the substrate W and detection of presence/absence of the substrate W. Here, arrangement of the light emitter 35a and the light detector 35b in FIG. 2 or arrangement of the light emitter 37a and the light detector 37b in FIG. 2 may be reversed. In addition, an optical axis L1 connects the light emitter 35a to the light detector 35b, and an optical axis L2 connects the light emitter 37a to the light detector 37b.

Figure 3:
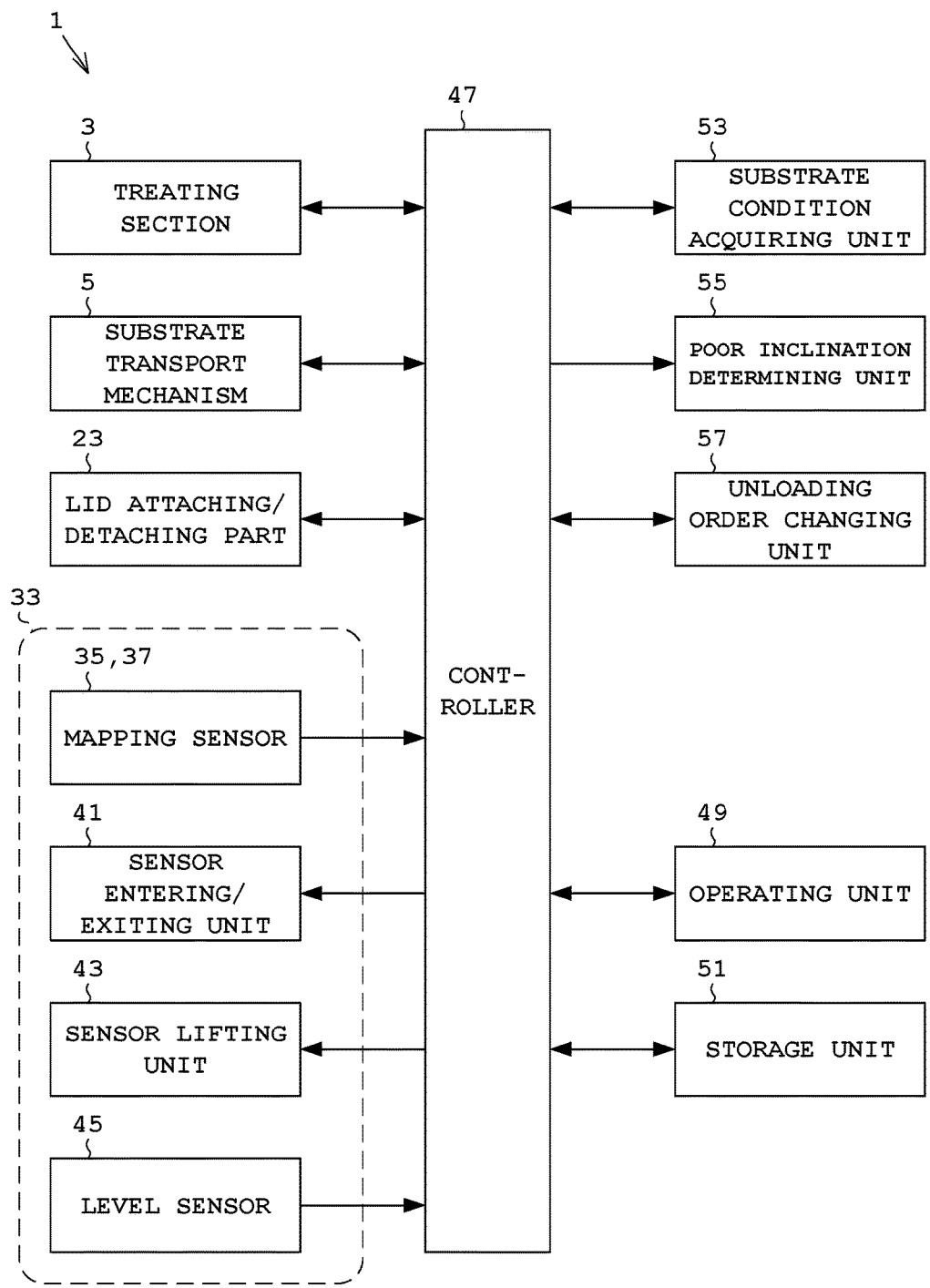
FIG. 3 is a block diagram illustrating a control system of the substrate treating apparatus.

FIG. 3 is a block diagram illustrating a control system of the substrate treating apparatus 1. The substrate treating apparatus 1 includes a controller 47 that controls en bloc elements of the apparatus 1, an operating unit 49 that operates the substrate treating apparatus 1, and a storage unit 51 that stores information detected with the mapping sensors 35 and 37 and the level sensor 45. The controller 47 is composed of a CPU and the like. The operating unit 49 includes a display unit such as a liquid crystal monitor, a keyboard, a mouse, and an input unit such as a switch. The storage unit 51 is formed by a storage medium including a demountable one such as a ROM (Read-only Memory), a RAM (Random-Access Memory), and a hard disk.

The substrate treating apparatus 1 includes a substrate condition acquiring unit 53 and a poor inclination determining unit 55. The mapping sensors 35 and 37 and the level sensor 45 acquire an inclination of the substrate W in the forward/backward direction U relative to the horizontal direction in accordance with the detected substrate levels at the two positions. The poor inclination determining unit 55 determines whether or not the inclination (absolute value) of the substrate W in the forward/backward direction U is larger than a pre-set threshold. The substrate treating apparatus 1 further includes an unloading order changing unit 57 that reverses an order, in regard to unloading of the substrates W within the carrier C from the top, between the poor inclined substrate Wf and a substrate W immediately above the poor inclined substrate Wf if the poor inclination determining unit 55 determines presence of the poor inclined substrate Wf.

Figure 4:
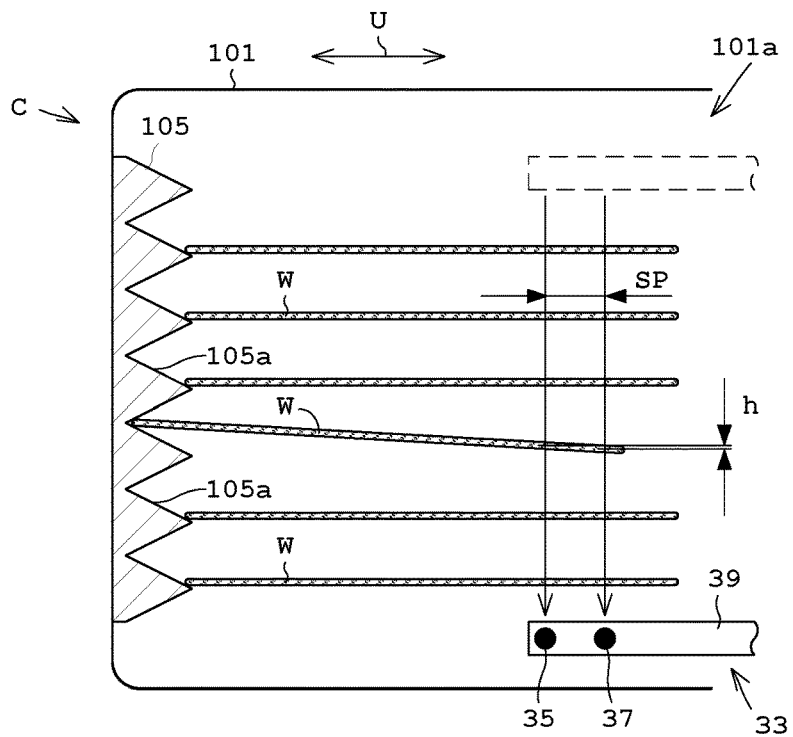
FIG. 4 illustrates operation of the mapping sensor.

In FIG. 4, the controller 47 moves the two pairs of mapping sensors 35 and 37 vertically with the sensor lifting unit 43 while the two pairs of mapping sensors 35 and 37 enter into the carrier C with the sensor entering/exiting unit 41. At this time, the two pairs of mapping sensors 35 and 37 detect presence/absence of the substrate W, and the level sensor 45 detects levels of the two pairs of mapping sensors 35 and 37 to detect substrate levels at different two positions in the forward/backward direction U.

The substrate condition acquiring unit 53 acquires an inclination of the substrate W in the forward/backward direction U relative to the horizontal direction in accordance with the two different substrate levels in the forward/backward direction U detected with the mapping sensors 35 and 37 and the level sensor 45. Such inclination acquirement is made from calculation or a table prepared in advance. An inclination is calculated from a distance between the optical axis L1 and the optical axis L2 in FIG. 2 (i.e., a distance between the mapping sensors 35 and 37), i.e., a sensing pitch SP, and a level difference h of the substrate levels at the two positions. For instance, a ratio of the sensing pitch SP and the level difference (gradient=h/SP) or an inclination angle of the substrate W angle (angle=$\tan^{-1}$ (h/SP)) is calculated. Here, the table is a list with correspondence of the sensing pitch SP and the level difference h of the substrate levels at the two positions to a pre-calculated inclination of the substrate W in the forward/backward direction U relative to the horizontal direction.

Figure 5:
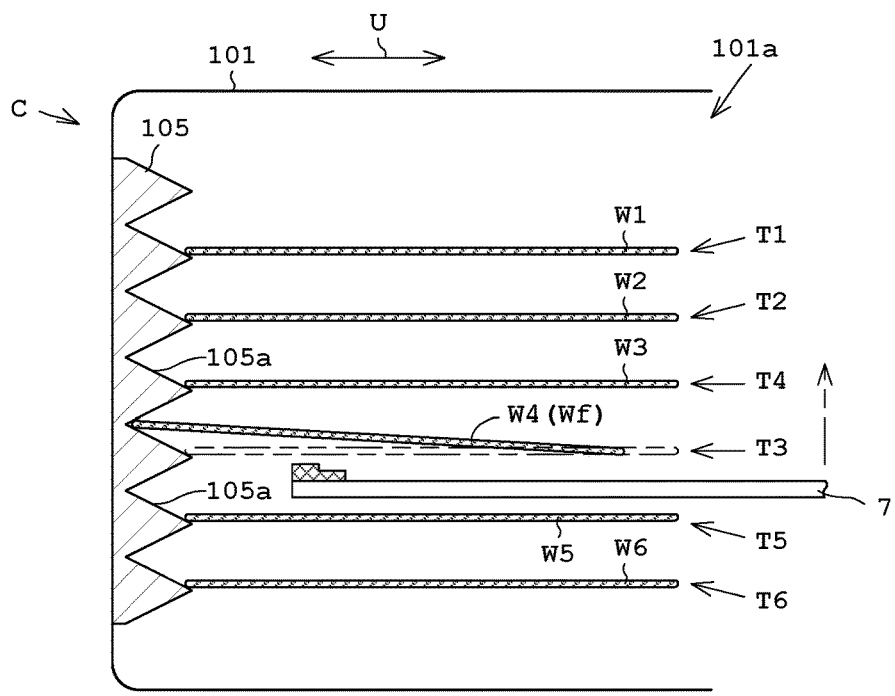
FIG. 5 illustrates change of a substrate unloading order when a single poor inclined substrate is disposed.

The following describes the unloading order changing unit 57. The substrates W within the carrier C are typically unloaded one by one from the top. The unloading order changing unit 57 reverses the order of unloading the substrates from the top. FIG. 5 illustrates change of the order of unloading the substrates W when a single poor inclined substrate Wf is present. Here, FIG. 5 illustrates six substrates W accommodated in the carrier C for illustration convenience. However, in actual, 25 substrates W are accommodated. In addition, a substrate W accommodated on a first stage from the top is denoted by a numeral W1. Likewise, substrates W on a second stage, and third to sixth stages from the top are denoted by a numeral W2, and W3 to W6, respectively.

FIG. 5 illustrates a substrate W4 on the fourth stage from the top as a poor inclined substrate Wf. In this case, the unloading order changing unit 57 reverses the order of unloading the substrates W so as to be one denoted by numeral T1 to T6 on the right of the substrate W1 to W6 in FIG. 5, respectively. That is, the unloading order changing unit 57 reverses the order between the poor inclined substrate Wf on the fourth stage and the substrate W3 on the third stage immediately above the poor inclined substrate Wf. Specifically, reverse is made so as to unload the substrates by an order of a substrate W1 on the first stage, a substrate W2 on the second stage, an "poor inclined substrate Wf (W4)" on the fourth stage, a "substrate W3 on the third stage", a substrate W5 on the fifth stage, and a substrate W6 on the sixth stage.

FIGS. 6(a) and 6(b) illustrate an unloading order of the substrates W with successive poor inclined substrates Wf. FIG. 6(a) illustrates poor inclined substrates Wf on the third and fourth stages. In such a case, the unloading order changing unit 57 reverses the order so as to be an order of a substrate W1 on the first stage, a "poor inclined substrate Wf (W4) on the fourth stage", a "poor inclined substrate Wf (W3) on the third stage", a "substrate W2 on the second stage", a substrate W5 on the fifth stage, and a substrate W6 on the sixth stage. In contrast to this, FIG. 6(b) illustrates poor inclined substrates Wf on the second to fifth stages. In such a case, the unloading order changing unit 57 reverses the order so as to be an order of a "poor inclined substrate Wf (W5) on the fifth stage", a "poor inclined substrate Wf (W4) on the fourth stage", a "poor inclined substrate Wf (W3)" on the third stage, a "poor inclined substrate Wf (W2) on the second stage", a "substrate W1 on the first stage", and a substrate W6 on the sixth stage.

Figure 6:
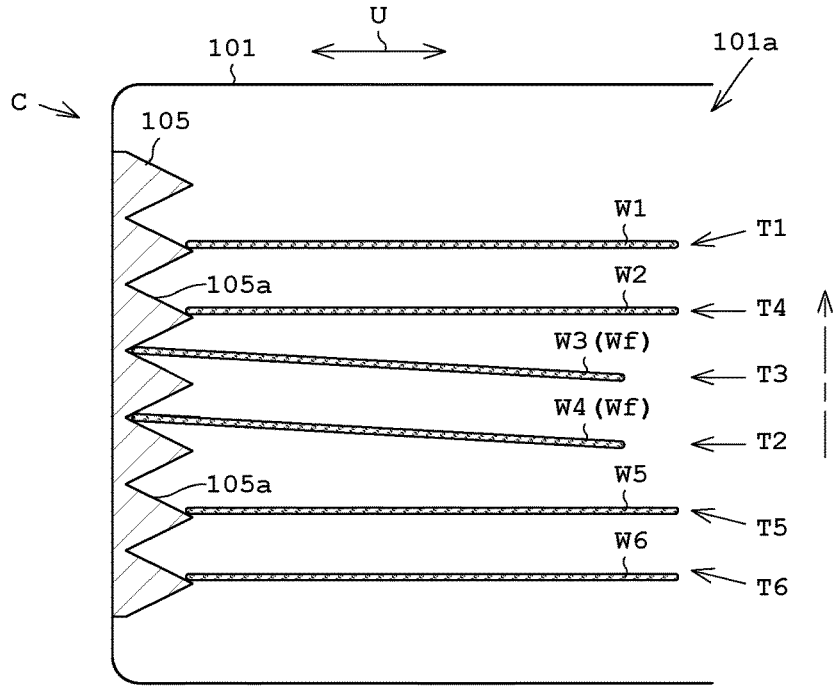
FIGS. 6(a) and (b) each illustrate change of a substrate unloading order when successive poor inclined substrates are disposed.
Figure 6:
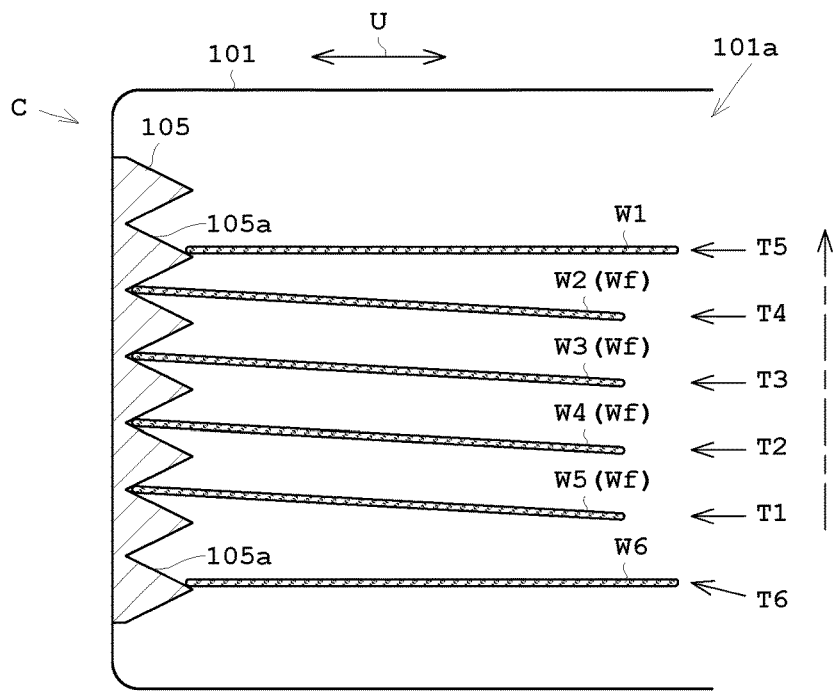

The following describes exception to change of the order of unloading the substrates W. When the poor inclined substrate Wf is on the first (uppermost) stage, there is no substrate W immediately above the substrate W1 (Wf). Accordingly, the substrates W on the second stage and lower stages thereof are to be changed in order. Moreover, when the poor inclined substrate Wf is placed on the lowermost stage (the sixth stage in FIG. 5), the substrate W(Wf) on the lowermost stage is able to be unloaded if a sufficient clearance is present between the lowermost poor inclined substrate Wf and the inner wall of the lower side of the carrier C. However, if a sufficient clearance is not present, a notification unit, not shown, may notify an operator about the clearance. In addition, when the poor inclined substrate W4 (Wf) is placed on the fourth stage and the substrate W3 is not present on the third stage immediately above the substrate W4 (Wf) in FIG. 5, there is no possibility of scratching the substrate surface with the hand 7. In contrast to this, when the successive poor inclined substrates Wf are present as illustrated in FIG. 6, the unloading order is reversed among the successive poor inclined substrates Wf (i.e., the substrates W are unloaded from the bottom).

In the foregoing description, reverse of the unloading order is made for the substrate W immediately above the poor inclined substrate Wf (the substrate W immediately above the poor inclined substrate Wf of the successive substrates on the uppermost stage) as one limit (a first limit) of the substrates to be unloaded. However, the substrate at least immediately above the poor inclined substrate Wf (e.g., above the poor inclined substrate Wf by two stages) may be reversed in order as one limit of the substrates to be unloaded. In addition, the substrate condition acquiring unit 53 may have the same configuration as that of the poor inclination determining unit 55 in the present embodiment. For instance, a substrate may be determined directly as the poor inclined substrate Wf if the level difference h is larger than the pre-set threshold.

The substrate condition acquiring unit 53, the poor inclination determining unit 55, and the unloading order changing unit 57 are each composed of hardware, software, or combination of hardware and software. Moreover, the mapping sensors 35 and 37, the sensor entering/exiting unit 41, the sensor lifting unit 43, the level sensor 45, and the controller 47 correspond to the substrate level detecting mechanism in the present invention. Moreover, the substrate levels at the two different positions in the forward/backward direction U correspond to substrate presence/absence and the substrate level in the present invention. The substrate level is determined from any position for substrate presence/absence, e.g., a middle or end level of the substrate when the substrate is present.

Operation of Substrate Treating Apparatus

The following describes operation of the substrate treating apparatus 1. Reference is made to FIG. 1(a). The carrier C is transported with the substrate treating apparatus 1, and is placed on the stage 19. The stage 19 is spaced away from the division wall 21. The stage 19 causes the carrier C to move toward the division wall 21 while holding the stage 19. Accordingly, an outer surface of the carrier C adjacent to the lid 102 closely contacts the division wall 21.

The lid attaching/detaching part 23 holds the lid 102 of the carrier C, and rotates a dial, not shown, to unlock the lid 102 relative to the container main body 101. Then the lid attaching/detaching part 23 detaches the lid 102 from the container main body 101, and moves the lid 102 to a "release position" below the pass port 21a adjacent to the treating section 3. After the lid 102 is detached, the sensor entering/exiting unit 41 of the mapping part 33 causes the mapping sensors 35 and 37 to enter into the carrier C through the opening 101a of the carrier C.

The controller 47 in FIG. 3 performs control as under. The sensor lifting unit 43 causes the mapping sensors 35 and 37 to move vertically while the mapping sensors 35 and 37 enter into the carrier C. In FIG. 4, the mapping sensors 35 and 37 are moved one time downward. However, such a detection direction may be upward. During the movement, the mapping sensors 35 and 37 detect presence/absence of the substrates W, and the level sensor 45 detects levels of the mapping sensors 35 and 37. Accordingly, the substrate levels are detected at the two different positions in the forward/backward direction U. That is, the substrate levels are detected at the two different positions in the forward/backward direction U in accordance with information by the mapping sensors 35 and 37 and the level sensor 45 about whether or not the optical axes L1 and L2 are shielded with the substrate W and information about the levels of the mapping sensors 35 and 37 when the optical axis L1 and L2 are shielded with the substrate W. At this time, the number and positions (stages) of substrates W are also detected.

The substrate condition acquiring unit 53 acquires an inclination of the substrate W in the forward/backward direction U relative to the horizontal direction in accordance with the levels of the substrate W at the two different positions in the forward/backward direction U. The inclination of the substrate W is obtainable by determining a gradient or an angle from the sensing pitch SP between the optical axes L1 and L2 and the level difference h of the substrate at the two positions. The poor inclination determining unit 55 determines whether or not the inclination of the substrate W is larger than the pre-set threshold. The storage unit 51 stores information about determination of whether or not the inclination of the substrate W in the carrier C is larger than the threshold.

Then, the unloading order changing unit 57 reverses the order, in regard to unloading of the substrates W from the top, between the poor inclined substrate Wf and the substrate W immediately above the poor inclined substrate Wf when the poor inclination determining unit 55 determines that the poor inclined substrate Wf whose inclination is larger is present. The substrates W are typically unloaded from the top in order. However, in FIG. 5, the unloading order is reversed between the poor inclined substrate Wf (W4) and the substrate W3 immediately above the poor inclined substrate Wf (W4). Moreover, when the successive poor inclined substrates Wf (W2 to W5) are present as in FIG. 6(b), the unloading order is reversed between the poor inclined substrate Wf (W5) on the lowermost stage (position) and the substrate W1 immediately above the poor inclined substrate Wf (W2) on the uppermost stage (position). Then information about the reversed unloading order is stored in the storage unit 51.

After the level of every substrate W in the carrier C at the two different positions is detected, the sensor entering/exiting unit 41 causes the mapping sensors 35 and 37 to exit from the carrier C, and the sensor lifting unit 43 causes the mapping sensors 35 and 37 to move further downward. This causes the mapping part 33 of the mapping sensors 35 and 37 and the like to retract into a position that does not obstruct unloading/accommodation of the substrates W in a similar manner to the lid attaching/detaching part 23. After the mapping part 33 is retracted, the substrate transport mechanism 5 unloads the substrates W in accordance with the changed order mentioned above.

The substrate W unloaded out of the carrier C is transported into the treating section 3 where given treatment is performed to the substrate W. Then, the substrate W transported out of the treating section 3 is moved back into the carrier C with the substrate transport mechanism 5. When the poor inclined substrate Wf is present, the unloading order of the substrates W is reversed while the substrates W are each returned to their original positions in the carrier C. That is, in FIG. 5, the poor inclined substrate Wf (W4) is unloaded prior to the substrate W3, whereas the poor inclined substrate Wf (W4) unloaded previously is returned back on the fourth stage from the top and the substrate W3 unloaded later is returned back to its original position on the third stage. At this time, the substrate W3 may be moved back into the carrier C prior to the substrate W4. After all the substrates W are moved back into the carrier C, the lid attaching/detaching part 23 attaches the lid 102 to the opening 101a of the container main body 101 of the carrier C, and locks the lid 102 to the container main body 101 and closes the pass port 21a. The stage 19 moves away from the division wall 21 to release its holding of the carrier C. The carrier C is transported to a next apparatus.

With the present embodiment, when the poor inclined substrate Wf is present whose inclination is determined larger than the pre-set threshold by the poor inclination determining unit 55, the unloading order changing unit 57 reverses the order, in regard to loading of the substrates W in the carrier C, between the poor inclined substrate Wf and the substrate W immediately above poor inclined substrate Wf. That is, the order is reversed such that the poor inclined substrate Wf having possibility of scratching its surface by the hand 7 is unloaded prior to the substrate W immediately above poor inclined substrate Wf. Accordingly, this inhibits damages on the substrates W caused by scratching the substrate surfaces with the hand 7 of the substrate transport mechanism 5.

Moreover, when the successive poor inclined substrates Wf are present, the unloading order changing unit 57 reverses the order between a poor inclined substrate Wf of the successive poor inclined substrates on the lowermost stage and a substrate W of the successive poor inclined substrates on the uppermost stage immediately above poor inclined substrate Wf. Accordingly, the order is reversible such that the poor inclined substrate Wf that may be scratched with the hand 7 is unloaded from the bottom even when the poor inclined substrates Wf are successive. This inhibits damages on the substrates W.

When the lid 102 that closes the opening 101a of the container main body 101 is detached, the substrates W may not slide downward from the grooves 105a of the rear holder 105 to remain at a forward-inclined condition. Even under such a condition, the order is reversed between the poor inclined substrate Wf whose surface may be scratched with the hand 7 and the substrate immediately above the poor inclined substrate Wf. This inhibits damages on the substrates W.

Moreover, the controller 47 performs control such that the sensor lifting unit 43 causes the mapping sensors 35 and 37 vertically while the sensor entering/exiting unit 41 causes the mapping sensors 35 and 37 to enter into the carrier C. During the movement, the mapping sensors 35 and 37 detect the presence/absence of the substrate W and the level sensor 45 detects the levels of the mapping sensors 35 and 37, thereby detecting the substrate levels in the forward/backward direction U at the two different positions. Accordingly, the substrate condition acquiring unit 53 allows acquirement of the inclination of the substrate W in the forward/backward direction U relative to the horizontal direction, and the poor inclination determining unit 55 allows determination of whether or not the inclination of the substrate W is larger than the pre-set threshold in accordance with the detected substrate levels in the forward/backward direction U at the two different positions.

In the foregoing description, the unloading order changing unit 57 reverses the order of unloading all the substrates W1 to W6 in the carrier C from the top. However, an order of unloading a part of the substrates, e.g., substrates W1 to W4 in the carrier C from the top, is reversible. At this time, the other substrates W5 and W6 may be unloaded from the top or from the bottom. Moreover, the other substrates W5 and W6 may be unloaded before or after the substrates W1 to W4. That is, the unloading order changing unit 57 may reverse the order of unloading all or a part of the substrates W in the carrier C from the top.

The present invention is not limited to the foregoing examples, but may be modified as follows.

(1) In the embodiment mentioned above, the order of unloading the substrates W is reversed based on the poor inclined substrate Wf (W4) as one limit of the substrates to be unloaded as in FIG. 5. Alternatively, the order may be reversible based on the substrate W5 immediately below the poor inclined substrate Wf (W4), i.e., downwardly away from the poor inclined substrate Wf(W4) by one stage, as one limit of the substrates to be unloaded. That is, the unloading order changing unit 57 reverses the order between the substrate W5 immediately below the poor inclined substrate Wf (W4) and the substrate W3 immediately above the poor inclined substrate Wf (W4). Accordingly, the substrates W1 to W6 in FIG. 5 are unloaded so as to be an order of a substrate W1 on the first stage, a substrate W2 on the second stage, a "substrate W5 on the fifth stage", a "poor inclined substrate Wf (W4) on the fourth stage", a "substrate W3 on the third stage", and a "substrate W6 on the sixth stage".

Moreover, when the successive poor inclined substrates Wf (W2 to W5) are present as in FIG. 6(b), the unloading order changing unit 57 reverses the order of unloading the substrates W disposed between the substrate W6 immediately below the poor inclined substrate Wf (W5) on the lowermost stage of the successive poor inclined substrates and the substrate W1 of the successive poor inclined substrates immediately above the poor inclined substrate Wf (W2) on the uppermost stage. Accordingly, the substrates W1 to W6 in FIG. 6(b) are unloaded in order of a "substrate W6 on the sixth stage", a "poor inclined substrate Wf (W5) on the fifth stage", a "poor inclined substrate Wf (W4) on the fourth stage", a "poor inclined substrate Wf (W3) on the third stage", a "poor inclined substrate Wf (W2) on the second stage", and a "substrate W1 on the first stage".

Here in the foregoing description of the modification, the order is reversed based on the substrate W immediately below the poor inclined substrate Wf (when the successive poor inclined substrates Wf are present, the substrate W immediately below the poor inclined substrate Wf of the successive poor inclined substrates Wf on the lowermost stage) as one limit of the substrates to be unloaded. Alternatively, the order may be reversed based on the substrate at least immediately below the poor inclined substrate Wf (e.g., by two stages).

Figure 7:
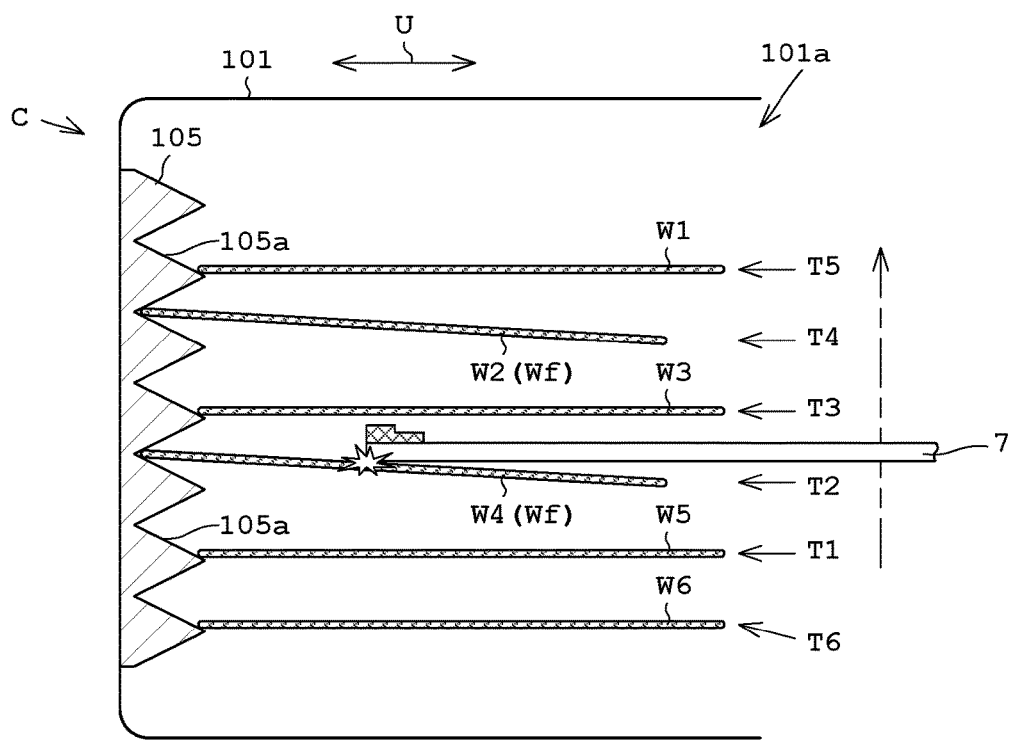
FIG. 7 illustrates change of a substrate unloading order according to one modification of the present invention.

Moreover, the following case is assumed. That is, poor inclined substrates Wf are placed on the second and fourth stages, and an unloading order is reversed taking the substrates W immediately below the poor inclined substrates Wf as one limit of the substrates to be unloaded as illustrated in FIG. 7. In this case, the unloading order changing unit 57 reverses the order of the poor inclined substrate Wf (W2) on the second stage so as to be an order of a "substrate W3 on the third stage", a "poor inclined substrate Wf (W2) on the second stage", and a substrate W1 on the first stage. However, upon unloading of the substrate W on the third stage, the hand 7 may contact the poor inclined substrate Wf (W4) on the fourth stage. Consequently, the unloading order changing unit 57 may reverse the order of the successive substrates Wf on the second to fourth stages under assumption that the substrates Wf are poor inclined substrates.

With the present modification, the unloading order changing unit 57 reverses the order of the substrates W between the substrate W immediately below the poor inclined substrate Wf and the substrate W immediately above the poor inclined substrate Wf. When the poor inclined substrate Wf is inclined forward, a clearance between the poor inclined substrate Wf and the substrate W immediately below the poor inclined substrate Wf may be small, leading to possibility of contact of the hand 7 to the substrate W. Accordingly, the order is reversed such that the substrate W immediately below the poor inclined substrate Wf is unloaded prior to the poor inclined substrate Wf. This inhibits the above possibility of contact.

Alternatively, when it is determined that at least one poor inclined substrate Wf is present in the carrier C, a rule may be set that the substrate W on the lowermost stage in the carrier C is always unloaded firstly regardless of the position of the poor inclined substrate Wf.

(2) In the embodiments and the modification (1) mentioned above, the substrate condition acquiring unit 53 acquires the inclination of the substrate W in the forward/backward direction U relative to the horizontal direction in accordance with the substrate levels at the two different positions in the forward/backward direction U. In contrast to this, in the present modification, the substrate condition acquiring unit 53 acquires a substrate positional deviation amount x in the horizontal direction toward the back of the container main body 101 in the carrier C as the inclination of the substrate W in the forward/backward direction U relative to the horizontal direction.

Figure 14:
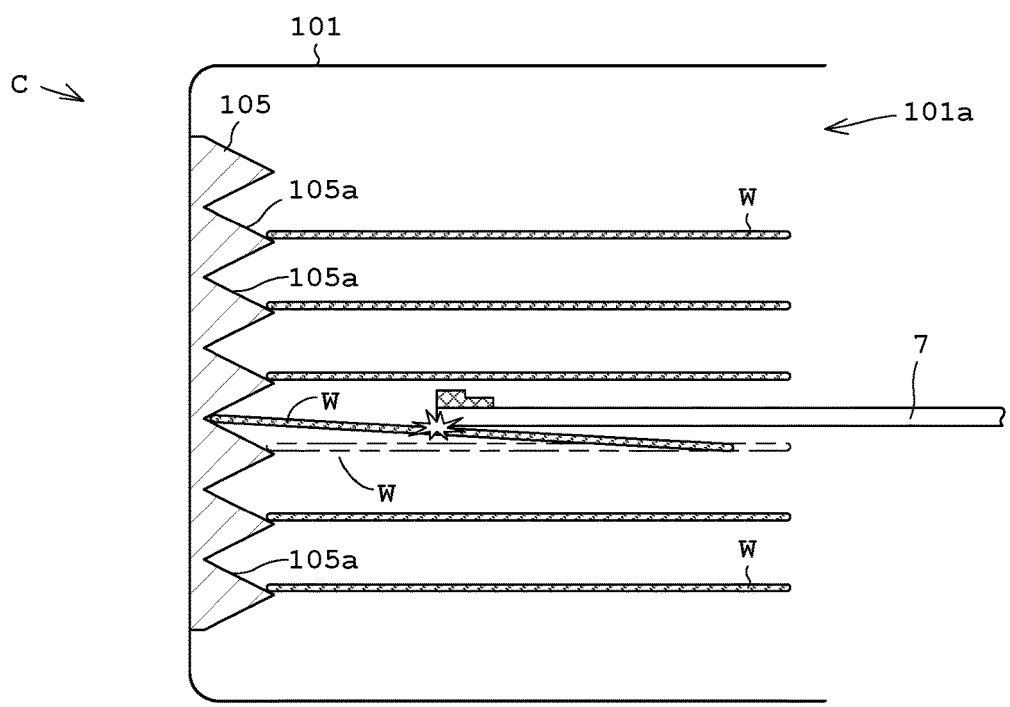
FIG. 14 illustrates a condition of accommodated substrates within the carrier.

When the lid 102 is detached in the carrier C of FIG. 13(a), the substrate W may not slide down appropriately from the V-shaped groove 105a of the rear holder 105, leading to possibility of forward inclined substrate W (see FIG. 14). When the substrate W is unloaded under such a condition, the substrate W slides over the groove 105a and deviates rearward. Accordingly, the hand 7 of the substrate transport mechanism 5 may fail to hold the substrate W.

Then, the substrate condition acquiring unit 53 acquires a substrate positional deviation amount (also referred to as a depth deviation amount) x toward the back of the container main body 101 in the horizontal direction in accordance with the levels of the substrate W at the two different positions in the forward/backward direction U detected with the mapping sensors 35 and 37 and the level sensor 45. The positional deviation amount x toward the back is determined from a pre-set table or calculation. Accordingly, a position of holding the substrate W with the hand 7 is adjustable, leading to prevention of damages on the substrate W through handling.

Figure 8:
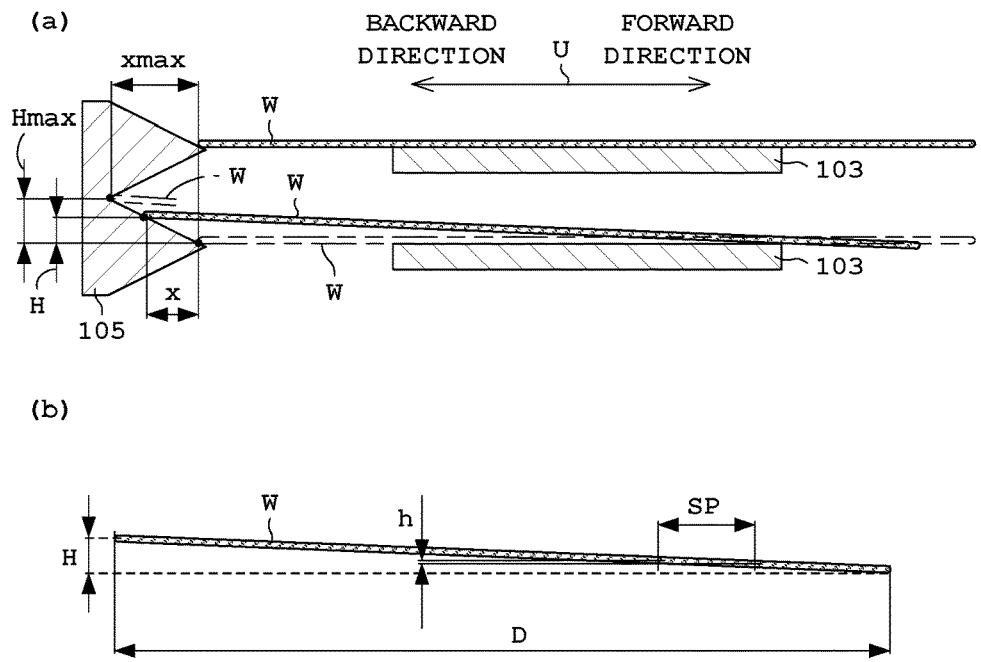
FIGS. 8(a) and (b) each illustrate a method of calculating a rearward substrate positional deviation amount according to the modification.

The following describes one example of the calculation in detail. However, the calculation is not limited to the following approach. FIG. 8 illustrates calculation of the substrate positional deviation amount toward the back. FIG. 8(a) illustrates an upper substrate W under a condition of sliding down appropriately from the V-shaped groove 105a and a lower substrate W under a condition of sliding down inappropriately from the groove 105a and thus is inclined forward. Then, taking the substrate W under the condition of sliding downward appropriately as a reference, the maximum substrate positional deviation amount xmax toward the back and the maximum substrate positional deviation amount Hmax toward the top are prepared. For instance, it is assumed that the maximum substrate positional deviation amount xmax toward back is 3 mm and the maximum substrate positional deviation amount Hmax toward the top is 3.5 mm.

In addition, as illustrated in FIG. 8(b), a sensing pitch (i.e., a pitch between the optical axes L1 and L2) of the mapping sensors 35 and 37 are, for example, set to be 30 mm. Moreover, a distance D is used taking a diameter of the substrate W as an approximate value, and it is assumed, for example, that the substrate W has a diameter of 450 mm. The mapping sensors 35 and 37 and the level sensor 45 detect the substrate levels at the two different positions in the forward/backward direction U to obtain a level difference h between the substrate levels.

From the above, calculation is performable along with the following formulae (1) to (4). That is, a relationship in the formula (1) is rewritten into the formula (2) and a relationship in the formula (3) is rewritten. Then, the formula (2) is substituted into the rewritten formula (3), whereby a relationship in the formula (4) is derived.

$$450:H=30:h \quad (1)$$

$$H=450 \times h/30 \quad (2)$$

$$H:x=3.5:3 \quad (3)$$

$$\begin{aligned}x &= 3 \times H/3.5 \\ &= 3 \times 450 \times h/30/3.5\end{aligned} \quad (4)$$

450: diameter of substrate (mm)
30: sensing pitch (mm)
h: difference of substrate level (mm)
H: substrate positional deviation amount in a height direction on rear holder side (upper side) (mm)
x: substrate positional deviation amount toward back (mm)

As noted above, the substrate condition acquiring unit 53 acquires the substrate positional deviation amount x in the horizontal direction toward the back of the container main body 101 from the sensing pitch SP, the distance D, the positional deviation amount xmax, and the positional deviation amount Hmax in accordance with the levels of the substrate W at the two different positions in the forward/backward direction U, i.e., in accordance with the level difference h. The acquired substrate positional deviation amount x toward the back is used for correcting a position where the hand 7 of the substrate transport mechanism 5 holds the substrate W.

Moreover, the substrate positional deviation amount x toward the back serves the function of the inclination of the substrate W in Embodiment 1. Accordingly, the poor inclination determining unit 55 determines whether or not the substrate positional deviation amount x toward the back is larger than the pre-set threshold. When the poor inclination determining unit 55 determines it large, the order of unloading the substrates W is reversed in the above manner.

With the present modification, the substrate condition acquiring unit 53 acquires the substrate positional deviation amount x in the horizontal direction toward the back of the container main body 101 as the inclination of the substrate W. The substrate positional deviation amount x toward the back similarly serves the function as the inclination of the substrate W. That is, the inclination of the substrate W becomes larger as the substrate positional deviation amount x toward the back is larger. Consequently, this inhibits damages on the substrate caused by contact of the hand 7 of the substrate transport mechanism 5 to the substrate W. Moreover, the substrate positional deviation amount x toward the back is acquired, whereby a position of holding the substrate with the hand 7 of the substrate transport mechanism 5 within the carrier C is correctable. Accordingly, this inhibits damages on the substrate caused by dropping of the substrate W due to handling failure.

Moreover, in the present modification, the substrate positional deviation amount x toward the back is acquired as the inclination of the substrate W. However, an upward substrate positional deviation amount H may be acquired as the inclination of the substrate W. That is, the vertical substrate positional deviation amount H on a rear holder side is also determined. If the hand 7 that unloads the substrate W immediately above the inclined substrate W enters below a horizontal plane defined by the shift amount H, the hand 7 contacts the inclined substrate W. Consequently, the shift amount H at which the hand 7 may possibility contact the inclined substrate W when the hand 7 enters between the inclined substrate W and the substrate W immediately above the inclined substrate W may be set as a threshold used for determination of whether or not the substrate W is a poor inclined substrate Wf.

If it is determined that the hand 7 is unable to enter between the inclined substrate W and the substrate W immediately above the inclined substrate W, the order of unloading the substrates W is reversed as noted above for avoiding contact of the inclined substrate W to the hand 7.

In addition, an entering track of the hand 7 is corrected such that the hand 7 enters above the horizontal plane defined by the shift amount H. This also prevents contact in advance of the hand 7 to the inclined substrate.

Figure 9:
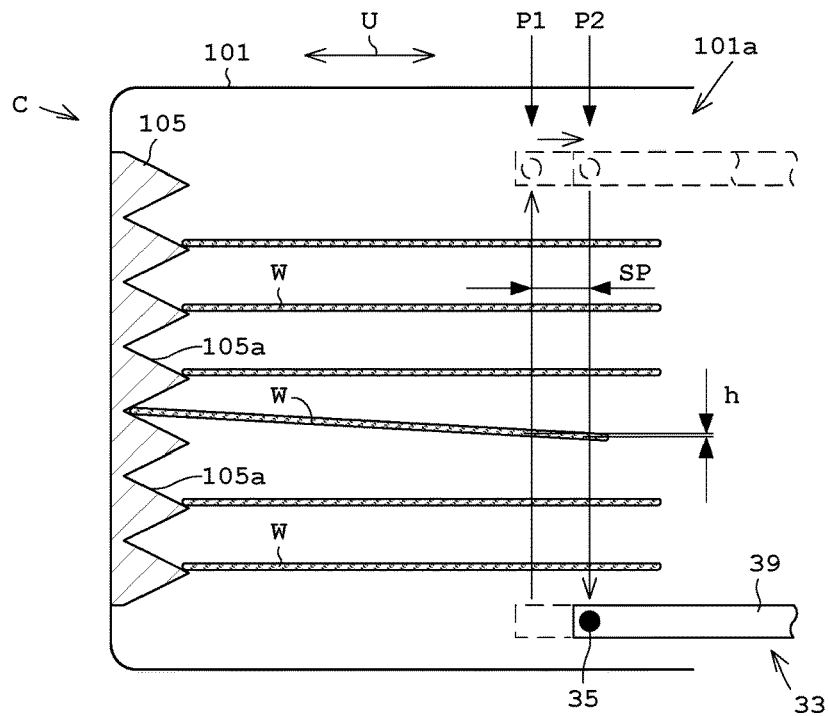
FIG. 9 illustrates operation of a mapping sensor according to the modification.

(3) In the embodiment and the modifications mentioned above, two pairs of mapping sensors 35 and 37 are configured for detecting the substrate levels at the two different positions in the forward/backward direction U. However, this is not limitative. For instance, as illustrated in FIG. 9, one pair of mapping sensors is configured and the sensors move vertically at the two different positions in the forward/backward direction U to detect the substrate levels at the two positions. Such is also applicable.

The controller 47 causes the sensor entering/exiting unit 41 to move the mapping sensors 35 to the two different positions in the forward/backward direction U while the sensor entering/exiting unit 41 causes the mapping sensors 35 to enter into the carrier C, and causes the sensor lifting units 43 to move the mapping sensors 35 vertically at each of the positions P1 and P2. During such operation, the controller 47 causes the mapping sensors 35 to detect presence/absence of the substrate W and causes the level sensor 45 to detect the level of the mapping sensors 35, thereby detecting the substrate levels at the two different positions in the forward/backward direction U.

Specifically, in FIG. 9, the mapping sensors 35 move upward at the position P1 in the forward/backward direction U to detect levels of the substrates W. Then, the mapping sensors 35 move into the position P2 in the forward/backward direction U, from which positions the mapping sensors 35 move downward to detect levels of the substrates W. This allows detection of all the levels of the substrates W within the carrier at the two different positions in the forward/backward direction U. Here, the number and the positions (stages) of the substrates W are also detected.

With the present modification, the mapping sensors 35 are moved at the two different positions in the forward/backward direction U, from which positions the sensor lifting unit 43 causes the mapping sensors 35 to move. Accordingly, a distance of the two positions for detecting the levels and a detection frequency are able to be set appropriately. For instance, this is applicable to an apparatus having only one-paired mapping sensors 35.

(4) In the embodiment and the modifications mentioned above, two pairs of mapping sensors 35 and 37 are configured. Alternatively, three or more pairs of mapping sensors may be provided. Moreover, in the modification (3) mentioned above, one pair of mapping sensors 35 are configured. However, two or more pairs of mapping sensors are configured and move vertically at two or more different positions in the forward/backward direction U to detect the substrate levels. Such is also applicable. When the substrate levels are detected at the two or more different positions in the forward/backward direction U, the substrate condition acquiring unit 53 may acquire the inclination of the substrate W based on any two of the positions.

Figure 10:
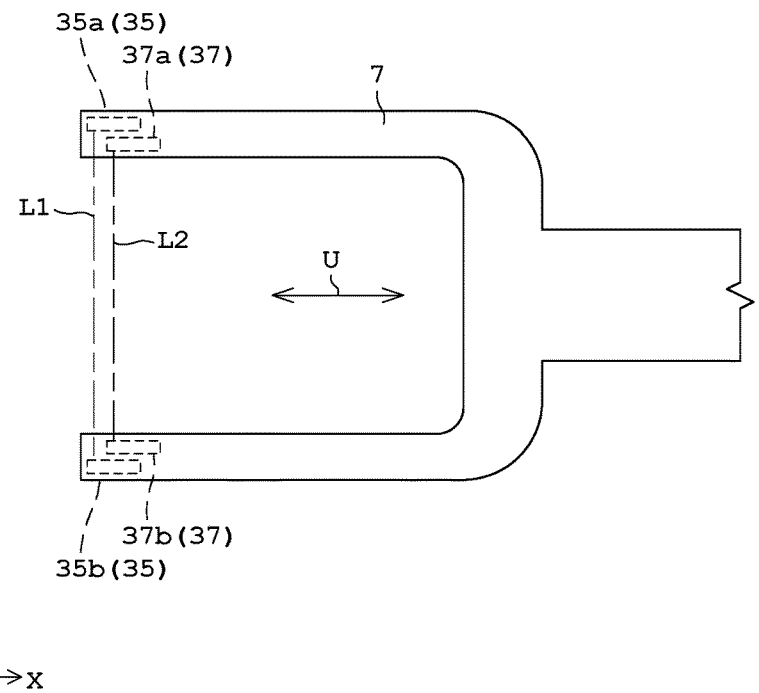
FIG. 10 illustrates a hand of a substrate transport mechanism according to the modification.

(5) In the embodiment and the modifications mentioned above, one or more pairs of mapping sensors are provided in the mapping part 33 operating independently of the lid attaching/detaching part 23. However, no mapping part 33 but another element may be provided. For instance, as illustrated in FIG. 10, two pairs of mapping sensors 35 and 37 may be provided at the tip ends of the hand 7 of the substrate transport mechanism 5. In such a case, the hand entering/exiting unit 9 corresponds to the entering/exiting mechanism in the present invention, and the hand lifting unit 11 corresponds to the vertical moving mechanism in the present invention.

Figure 11:
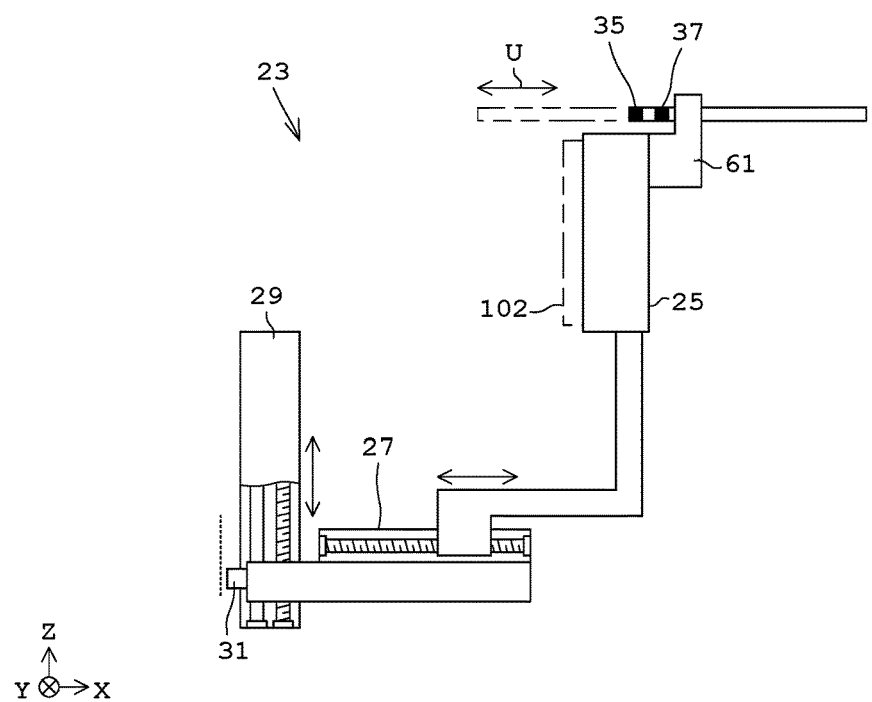
FIG. 11 illustrates a lid attaching/detaching part according to the modification.

Moreover, as illustrated in FIG. 11, the lid attaching/detaching part 23 may include a sensor entering/exiting unit 61 that moves the mapping sensors 35 and 37 in the forward/backward direction U. In such a case, the sensor entering/exiting unit 9 corresponds to the entering/exiting mechanism in the present invention, and the lid lifting unit 29 corresponds to the vertical moving mechanism in the present invention. In addition, the sensor entering/exiting unit 61 may pivot the two pairs of mapping sensors 35 and 37 around the pre-set position as the rotation center. Moreover, the sensor entering/exiting unit 61 may perform combination of linear movement and pivot movement.

(6) In the embodiment and modifications mentioned above, a MAC is used for the carrier C as in FIGS. 13(a) to 13(c). However, this is not limitative. For instance, the carrier C may be of a FOUP (Front Open Unified Pod) type. In such a case, a forward inclined condition of the substrate W is detected that is caused by variation in position of a holder of the FOUP under aged deterioration, the holder of the FOUP corresponding to the side holder 103 in FIGS. 13(a) to 13(c). This is also applicable to a carrier C in which the substrate W is inclined forward through sliding over the groove 105a of the rear holder 105 as in FIG. 13(a).

Figure 12:
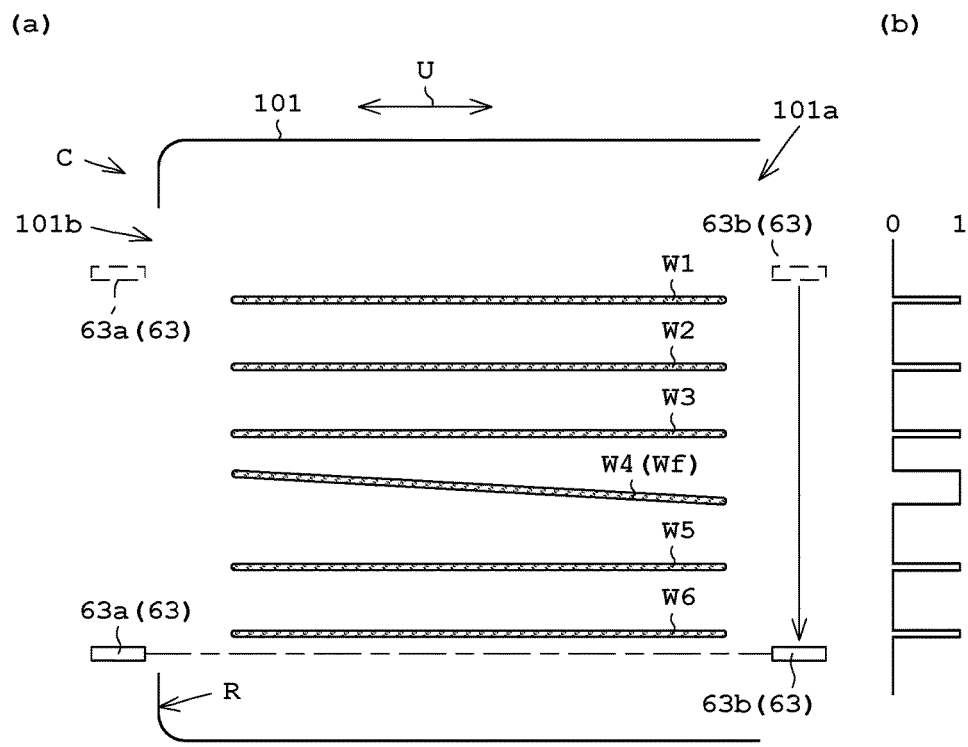
FIG. 12(a) illustrates operation of the mapping sensor and the like according to the modification.
FIG. 12(b) illustrates one example of output signals.

Moreover, it is assumed that, besides the opening 101a through which the substrates W are loaded/unloaded, a carrier is used as in Patent Literature 2 having another opening 101b on a rear face R of the interior container main body 101 as illustrated in FIG. 12(a). In this case, the mapping sensor 63 in FIG. 12(a) may be provided. When seen the carrier C laterally, the mapping sensor 63 includes one pair of light emitters 63a and light detectors 63b that detect presence/absence of the substrates W in the forward/backward direction U (toward the back of the substrates W) and the horizontal direction through two openings 101a and 101b. The light emitter 61a and the light detector 61b move vertically, whereby the presence/absence and levels of the substrates W are detected. FIG. 12(b) illustrates one example of output signals. If a substrate W is detected, a signal of "1" is outputted. If no substrate W is detected, a signal of "0" is outputted.

The substrate condition acquiring unit 53 acquires an inclination of the substrate W in the forward/backward direction U relative to the horizontal direction in accordance with the detected presence/absence and the levels (length) of the substrate W. For instance, if the signal of "1" outputted upon detection of the substrate W is longer than the pre-set length, it is recognized that the substrate W is inclined forward. The poor inclination determining unit determines whether or not the inclination of the substrate W is larger than the pre-set threshold. Here in the present modification, the substrate condition acquiring unit 53 may be same in configuration as the poor inclination determining unit 55. For instance, if the signal of "1" outputted upon the detection of the substrate W is larger than the pre-set length, it may be directly determined that the substrate is a poor inclined substrate Wf.

(7) In the embodiment and the modifications mentioned above, the mount table 4 may include the substrate condition acquiring unit 53, the poor inclination determining unit 55, and the unloading order changing unit 57. In addition, both the substrate treating apparatus 1 and the mount table 4 may include the controller 47, the operating unit 49, and the storage unit 51.

(8) In the embodiment and modifications mentioned above, the mapping sensors 35, 37, and 63 perform detection through light. However, another detection such as sonic detection is also adoptable. Moreover, reflection-type detection rather than transmission type detection is also applicable.

(9) In the embodiments and the modifications mentioned above, the substrate treating apparatus has been described that performs control such that a basic order of unloading the substrates downward from the top in the carrier is determined in advance, and if the poor inclined substrate is detected, the basic order of unloading the substrates is reversed between the poor inclined substrate and the substrate immediately above the poor inclined substrate. However, the basic unloading order is not necessarily determined in advance. After the substrates within the carrier are determined for poor inclination, and a rule of unloading the substrates is set such that the poor inclined substrate is unloaded prior to the substrate immediately above the poor inclined substrate, whereby damages on the poor inclined substrate caused by the hand is avoidable. This is a principal objective of the present invention. Accordingly, substrates other than the poor inclination substrate may be unloaded in any order from the carrier. For instance, substrates other than the poor inclination substrate may be unloaded one by one downward from the top stage in the carrier or upward from the bottom stage in the carrier. Moreover, the substrates may be unloaded not one by one but by every n-number (n: any natural number).

REFERENCE SIGNS LIST

1 . . . substrate treating apparatus
4 . . . mount table
5 . . . substrate transport mechanism
7 . . . hand
23 . . . lid attaching/detaching part
33 . . . mapping part
35, 37, 63 . . . mapping sensor
41 . . . sensor entering/exiting unit
43 . . . sensor lifting unit
45 . . . level sensor
47 . . . controller
53 . . . substrate condition acquiring unit
55 . . . poor inclination determining unit
57 . . . unloading order changing unit
101 . . . container main body
101a . . . opening
102 . . . lid
103 . . . side holder
105 . . . rear holder
107 . . . front holder
105a, 107a . . . V-shaped groove
Wf . . . poor inclined substrate
W1 to W6 . . . substrate
T1 to T6 . . . unloading order

The invention claimed is:

1. A substrate treating apparatus, comprising:
a mount unit on which a carrier for accommodating a plurality of substrates is placed;
a substrate level detecting mechanism that detects presence/absence of a substrate and a level of the substrate;
a substrate condition acquiring unit that acquires an inclination of the substrate in a forward/backward direction relative to a horizontal direction in accordance with the detected presence/absence of the substrate and the detected level of the substrate;
a poor inclination determining unit that determines whether or not the inclination of the substrate is larger than a pre-set threshold; and
an unloading order changing unit that reverses an order, in regard to unloading of the plurality of substrates in the carrier from the top, between the poor inclined substrate and a substrate at least immediately above the poor inclined substrate when the poor inclination determining unit determines presence of the poor inclined substrate.

2. The substrate treating apparatus according to claim 1, wherein
when successive poor inclined substrates are present, the unloading order changing unit reverses the order between a poor inclined substrate of the successive poor inclined substrates on the lowermost stage and a substrate at least immediately above the poor inclined substrate of the successive poor inclined substrates on the uppermost stage.

3. The substrate treating apparatus according to claim 1, wherein
the unloading order changing unit reverses the order between a substrate at least immediately below the poor inclined substrate and a substrate at least immediately above the poor inclined substrate.

4. The substrate treating apparatus according to claim 1, wherein
the carrier comprises:
a container main body;
a lid that closes an opening of the container main body and is attachable/detachable to/from the container main body;

a side holder provided on both side faces of the interior container main body and places the substrates thereon;

a rear holder provided on a rear face of the interior container main body and having grooves formed thereon; and a front holder provided on a face of the lid directed to the interior container main body and having grooves formed thereon, wherein the rear holder and the front holder nip the substrates while separating the substrates from the side holder when the lid is attached to the opening of the container main body.

5. The substrate treating apparatus according to claim 1, wherein the substrate level detecting mechanism comprises:

a presence/absence sensor that is directed horizontally orthogonal to the forward/backward direction where the substrates are loaded/unloaded into/from the carrier and detects presence/absence of the substrate;

a level sensor that detects a level of the presence/absence sensor;

a vertical moving mechanism that moves the presence/absence sensor vertically;

an entering/exiting mechanism that moves the presence/absence sensor into the carrier through the opening of the carrier; and a controller that detects substrate levels at two or more different positions in the forward/backward direction by moving the presence/absence sensor vertically with the vertical moving mechanism and detecting the presence/absence of the substrates with the presence/absence sensor and detecting a level of the presence/absence sensor with the level sensor while the presence/absence sensor enters into the carrier with the entering/exiting mechanism.

6. A substrate treating method, comprising:

a detecting step of detecting presence/absence and levels of a plurality of substrates in a carrier placed on a mount unit with a substrate level detecting mechanism;

an acquiring step of acquiring an inclination of a substrate in a forward/backward direction relative to a horizontal direction in accordance with the detected presence/absence and the detected levels of the substrates with a substrate condition acquiring unit;

a determining step of determining whether or not the inclination of the substrate is larger than a pre-set threshold with a poor inclination determining unit;

a changing step of reversing an order, in regard to unloading of the plurality of substrates in the carrier from the top, between the poor inclined substrate and a substrate at least immediately above the poor inclined substrate with an unloading order changing unit when the poor inclination determining unit determines presence of the poor inclined substrate.

7. A substrate treating apparatus, comprising:

a mount unit on which a carrier for accommodating a plurality of substrates is placed;

a substrate level detecting mechanism that detects presence/absence of the substrates and levels of the substrates;

a substrate condition acquiring unit that acquires an inclination of a substrate in a forward/backward direction relative to a horizontal direction in accordance with the detected presence/absence of the substrates and the detected levels of the substrates;

a poor inclination determining unit that determines whether or not the inclination of the substrate is larger than a pre-set threshold; and an unloading order changing unit that sets an unloading order between a poor inclined substrate and a substrate immediately above the poor inclined substrate so as to unload the poor inclined substrate prior to the substrate immediately above the poor inclined substrate when the poor inclination determining unit determines presence of the poor inclined substrate, and sets an order of unloading substrates other than the poor inclined substrate and the substrate immediately above the poor inclined substrate.

* * * * *